United States Patent
Liao et al.

(10) Patent No.: US 11,075,351 B2
(45) Date of Patent: Jul. 27, 2021

(54) PACKAGING STRUCTURE WITH GROOVE

(71) Applicant: NANOBIT TECH. CO., LTD., Taoyuan (TW)

(72) Inventors: Shih-Wen Liao, Taoyuan (TW); Yu-Yang Chang, Taoyuan (TW)

(73) Assignee: NANOBIT TECH. CO., LTD., Taoyuan (TW)

( * ) Notice: Subject to any disclaimer, the term of this patent is extended or adjusted under 35 U.S.C. 154(b) by 297 days.

(21) Appl. No.: 16/249,554

(22) Filed: Jan. 16, 2019

(65) Prior Publication Data

US 2020/0185631 A1 Jun. 11, 2020

(30) Foreign Application Priority Data

Dec. 5, 2018 (TW) .................................. 107143710

(51) Int. Cl.
*H01L 51/44* (2006.01)
*H01L 31/048* (2014.01)
*H01L 51/52* (2006.01)
*G02F 1/161* (2006.01)

(52) U.S. Cl.
CPC ............ *H01L 51/448* (2013.01); *G02F 1/161* (2013.01); *H01L 31/0481* (2013.01); *H01L 51/5256* (2013.01)

(58) Field of Classification Search
CPC ............. H01L 31/0481; H01L 51/5253; H01L 51/448; H01L 51/5256
See application file for complete search history.

(56) References Cited

U.S. PATENT DOCUMENTS

| | | | | |
|---|---|---|---|---|
| 4,243,432 A | * | 1/1981 | Jordan | H01L 31/03365 136/244 |
| 4,609,770 A | * | 9/1986 | Nishiura | H01L 31/0504 136/244 |
| 4,746,618 A | * | 5/1988 | Nath | H01L 31/03921 438/62 |
| 4,754,544 A | * | 7/1988 | Hanak | H01L 31/206 438/66 |
| 5,296,043 A | * | 3/1994 | Kawakami | H01L 31/022425 136/244 |
| 5,330,583 A | * | 7/1994 | Asai | H01L 31/0504 136/251 |

(Continued)

*Primary Examiner* — Golam Mowla
(74) *Attorney, Agent, or Firm* — Chun-Ming Shih; HDLS IPR Services

(57) ABSTRACT

A packaging structure with groove includes a substrate, a lower conductive layer, an optical element, a sealing layer and a barrier layer. The lower conductive layer is arranged on one face of the substrate. The optical element is arranged on one face of the lower conductive layer. The upper conductive layer is arranged on one face of the optical element. The packaging structure further comprises a groove defined on an inactive area of the optical element. The sealing layer is arranged on one face of the optical element and on one face of the upper conductive layer. The barrier layer is arranged on one face of the sealing layer. Because the groove is formed on inactive area of the optical element to enhance lateral sealing tightness, extended interface is provided between sealing layer/barrier layer and the substrate, thus enhance the water-resistant and gas-resistant property for package.

20 Claims, 6 Drawing Sheets

(56) References Cited

U.S. PATENT DOCUMENTS

| | | | | |
|---|---|---|---|---|
| 5,717,255 A * | 2/1998 | Haga | ............... | H01L 23/3164 |
| | | | | 136/251 |
| 7,772,484 B2 * | 8/2010 | Li | ............... | H01L 27/301 |
| | | | | 136/244 |
| 2007/0186971 A1 * | 8/2007 | Lochun | ............... | H01L 31/0512 |
| | | | | 136/256 |
| 2009/0301560 A1 * | 12/2009 | Nakai | ............... | H01L 31/0747 |
| | | | | 136/256 |
| 2015/0068600 A1 * | 3/2015 | Fujimoto | ............ | H01L 51/5253 |
| | | | | 136/259 |

* cited by examiner

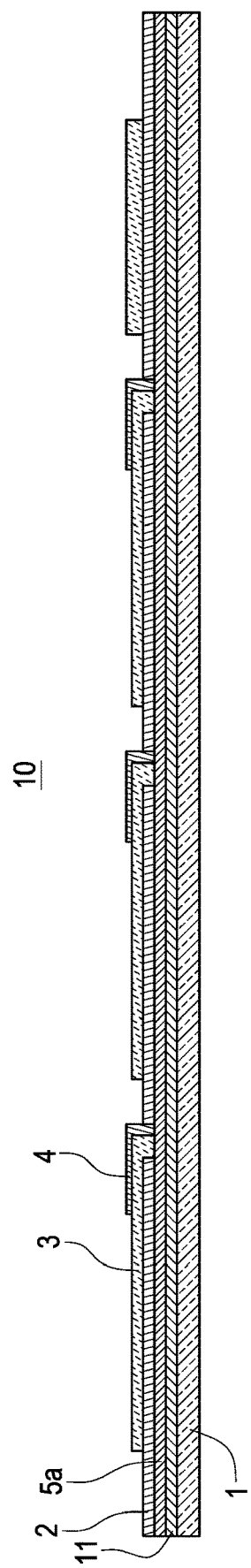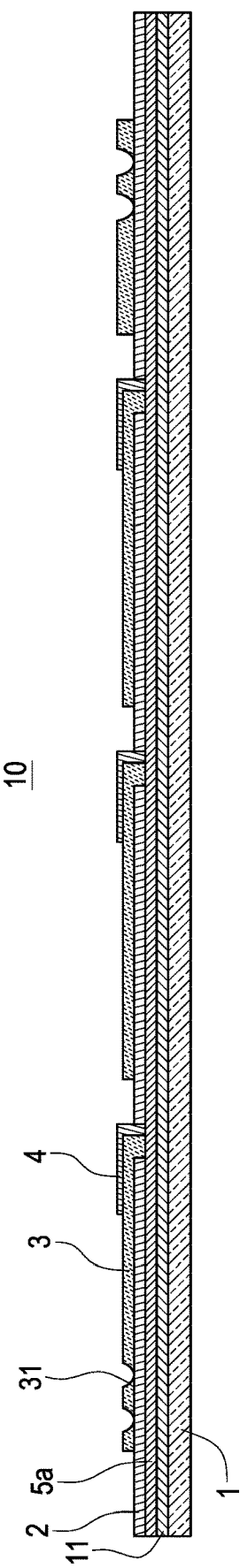

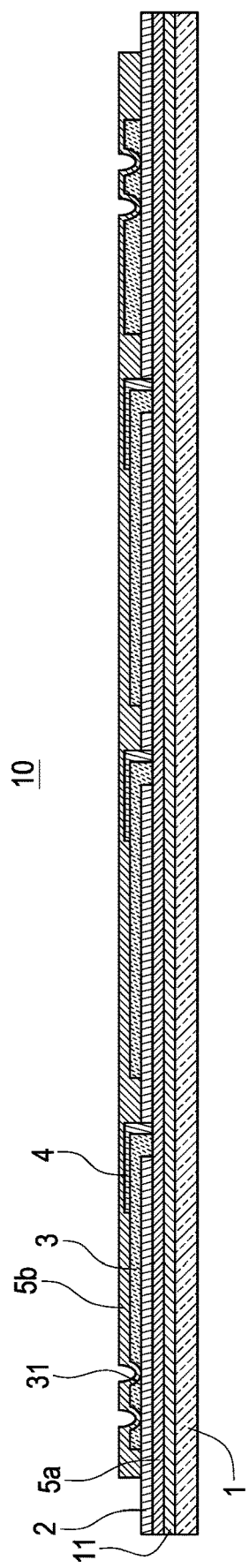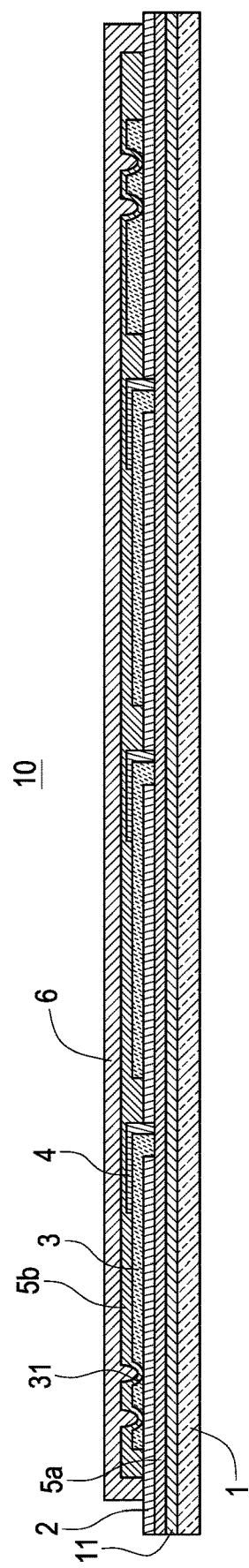

PACKAGING STRUCTURE WITH GROOVE

BACKGROUND OF THE INVENTION

Field of the Invention

The present invention relates to a packaging structure for electronic device, especially to a packaging structure with groove for electronic device with thin substrate.

Description of Prior Art

Generally, the packaging element needs to achieve moisture-resistant and oxygen-resistant sealing effect to protect the environmentally-sensitive electronic devices (such as OLEDs or thin film photovoltaic cells) encapsulated therein because certain environmental condition is required for the sensitive electronic devices. The packaging element prevents the encapsulated electronic devices from the impact of external temperature and humidity, thus prevents the failure or degradation in performance and the damage of the entire environmentally-sensitive electronic device, and further ensure the quality and lifespan of the electronic devices.

The ordinary packaging techniques for electronic devices (such as OLEDs or thin film photovoltaic cells) frequently use ethylene-vinyl acetate copolymers resins (EVA) with excellent moisture-resistant ability as packaging material or are attached with barrier film to form water-resistant and gas-resistant film. However, the above material has the problem of degradation or becoming yellowish as being irradiated by ultraviolet light of sunshine, or has limited lifespan for the water-resistant or gas-resistant material thereof. As a result, the product using OLED or solar cell is also influenced in terms of efficiency, product appearance or lifespan.

Taiwan patent Gazette 1479940 discloses a nanoparticulate encapsulation battier stack using plural layers of composite material having stacks of inorganic packaging layer and barrier layer. Taiwan patent Gazette 1549290 discloses a foldable package structure to increase bonding interface region or area. However, as the electronic devices become more compact, the above-mentioned prior arts are disadvantageous due to the inefficient use of the available region and space.

SUMMARY OF THE INVENTION

It is an object of the present invention to provide a packaging structure with groove for electronic device with thin substrate, where groove is defined on inactive area of the optical element of the thin device to enhance the water-resistant and gas-resistant property for package.

Accordingly, the packaging structure with groove of the present invention comprises: a substrate; a lower conductive layer arranged on one face of the substrate; an optical element arranged on one face of the lower conductive layer; and an upper conductive layer arranged on one face of the optical element. The packaging structure further comprises a groove defined on an inactive area of the optical element, a sealing layer on one face of the optical element and on one face of the upper conductive layer, and a barrier layer on one face of the sealing layer.

According one aspect of the present invention, the substrate is light-transparent plastic substrate or light-transparent glass substrate.

According another aspect of the present invention, the packaging structure further comprises a cured layer between the substrate and the lower conductive layer.

According still another aspect of the present invention, the optical element is organic light emitting diode (OLED), electro-chromic display, or photovoltaic cell.

According still another aspect of the present invention, the photovoltaic cell is organic solar cell or perovskite thin film solar cell.

According still another aspect of the present invention, the groove has width of 10 μm-100 μm.

According still another aspect of the present invention, the groove comprises a plurality of layers of annular groove structures or loop groove structures repeatedly stacked on each other.

According still another aspect of the present invention, the sealing layer is inorganic metallic oxide.

According still another aspect of the present invention, the inorganic metallic oxide is aluminum oxide, zinc oxide, zicronium oxide, silicon oxide, hafnium oxide or the combination thereof.

According still another aspect of the present invention, the barrier layer is poly sodium metasilicate, polyvinyl alcohol (PVA), polyacrylate, polyvinyl butyral (PVB), poly hydroxyethyl methacrylate (pHEMA), epoxy or the combination thereof.

According still another aspect of the present invention, the sealing layer and the barrier layer are repeatedly and alternately stacked.

Accordingly, the packaging structure with groove of the present invention comprises: a substrate; a first sealing layer arranged on one face of the substrate; a lower conductive layer arranged on one face of the first sealing layer; an optical element arranged on one face of the lower conductive layer; and an upper conductive layer arranged on one face of the optical element. The packaging structure further comprises a groove defined on an inactive area of the optical element, a second sealing layer on one face of the optical element and on one face of the upper conductive layer, and a barrier layer on one face of the sealing layer.

According one aspect of the present invention, the substrate is light-transparent plastic substrate or light-transparent glass substrate.

According another aspect of the present invention, the packaging structure further comprises a cured layer between the substrate and the lower conductive layer.

According still another aspect of the present invention, the optical element is organic light emitting diode (OLED), electro-chromic display, or photovoltaic cell.

According still another aspect of the present invention, the photovoltaic cell is organic solar cell or perovskite thin film solar cell.

According still another aspect of the present invention, the groove has width of 10 μm-100 μm.

According still another aspect of the present invention, the groove comprises a plurality of layers of annular groove structures or loop groove structures repeatedly stacked on each other.

According still another aspect of the present invention, the sealing layer is inorganic metallic oxide.

According still another aspect of the present invention, the inorganic metallic oxide is aluminum oxide, zinc oxide, zicronium oxide, silicon oxide, hafnium oxide or the combination thereof.

According still another aspect of the present invention, the barrier layer is poly sodium metasilicate, polyvinyl alcohol (PVA), polyacrylate, polyvinyl butyral (PVB), poly hydroxyethyl methacrylate (pHEMA), epoxy or the combination thereof.

According still another aspect of the present invention, the sealing layer and the barrier layer are repeatedly and alternately stacked.

Besides above main object, in the packaging structure of the present invention, the sealing layer and the barrier layer can be repeatedly and alternately stacked (coated) with each other to increase the packaging thickness.

Groove is formed on inactive area of the optical element to enhance lateral sealing tightness and to provide extended interface between sealing layer/barrier layer and the substrate, thus enhance the water-resistant and gas-resistant property for package.

According to another object, the packaging structure of the present invention can be used for thin device and reduce the ineffective area and structural waste, thus make the device more compact.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

FIG. 8 shows that the lower conductive layer, the optical element and the upper conductive layer are formed on the first sealing layer of the thin device shown in FIG. 7.

FIG. 9 shows that the groove structure is defined on the thin device of FIG. 8.

FIG. 10 shows that the second sealing layer is formed on the optical element and the upper conductive layer in the thin device shown in FIG. 9.

FIG. 11 shows the thin device after the barrier layer is formed on the second sealing layer.

DETAILED DESCRIPTION OF THE INVENTION

Figure 1:
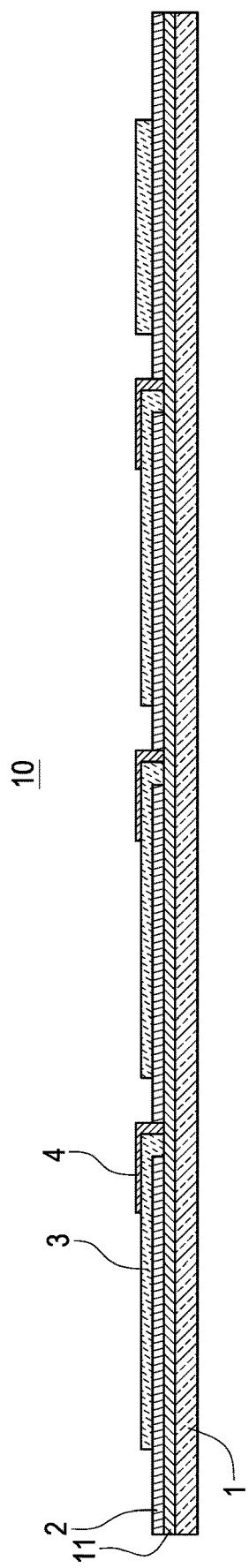
FIG. 1 shows a sectional view of the thin device according to the first embodiment of the present invention.

FIG. 1 shows a sectional view of the thin device according to the first embodiment of the present invention. The packaging structure with groove according to the present invention has a thin device formed with groove. The thin device 10 comprises a substrate 1, a lower conductive layer 2, an optical element 3, and an upper conductive layer 4.

The substrate 1 is a light-transparent plastic substrate or a light-transparent glass substrate. The light-transparent plastic material is, for example, Polyimide (PI), hybrid PI, Polyethylene terephthalate (PET), Polyethers Ulfone (PES), Polyethylene naphthalatc (PEN), Cyclo olefin polymer (COP) or fiberglass reinforced plastic substrate. One face of the substrate 1 is cured to form a cured layer 11 to enhance the firmness of the substrate 1. The main component of the cured layer 11 is silicon dioxide. In the shown embodiment, the thickness of the cured layer 11 is 1 μm-3 μm.

The lower conductive layer 2 is arranged on one face of the cured layer 11. The lower conductive layer 2 is formed through etching process for inorganic conductive material to have a plurality of transparent electrode circuits (not shown in FIG. 1) and is electrically connected to external device through a connection circuit (not shown). In the embodiment shown in FIG. 1, the inorganic conductive material may be indium tin oxide or silvery paste.

The optical element 3 is arranged on one face of the lower conductive layer 2. The optical element 3 is, for example, organic light emitting diode (OLED), electro-chromic display, or photovoltaic cell. The photovoltaic cell may be organic solar cell, perovskite thin film solar cell. In the shown embodiment, the photovoltaic cell is sequentially coated with an electron transport layer, an active layer, and a hole transport layer; or is sequentially coated with a hole transport layer, an active layer, and an electron transport layer.

The upper conductive layer 4 is arranged on one face of the optical element 3. The upper conductive layer 4 is formed through etching process for inorganic conductive material to have a plurality of transparent electrode circuits (not shown in FIG. 1) and is electrically connected to external device through a connection circuit (not shown). In the embodiment shown in FIG. 1, the inorganic conductive material may be indium tin oxide or silvery paste.

Figure 2:
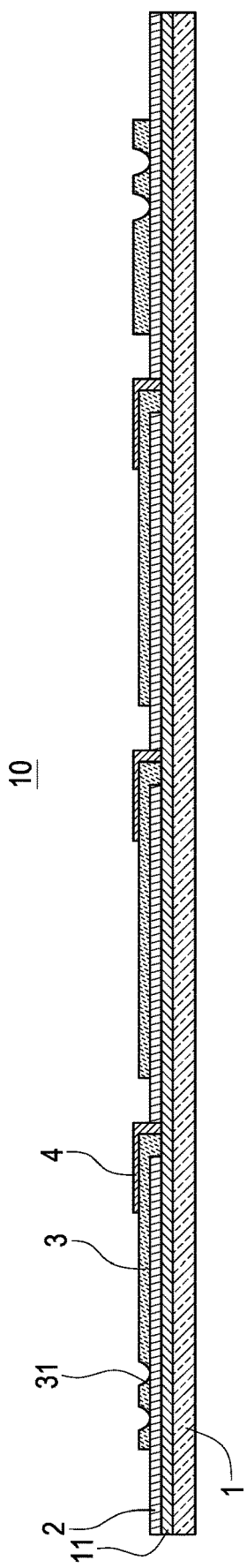
FIG. 2 shows that the groove structure is defined on the optical element of the thin device in FIG. 1.
Figure 5:
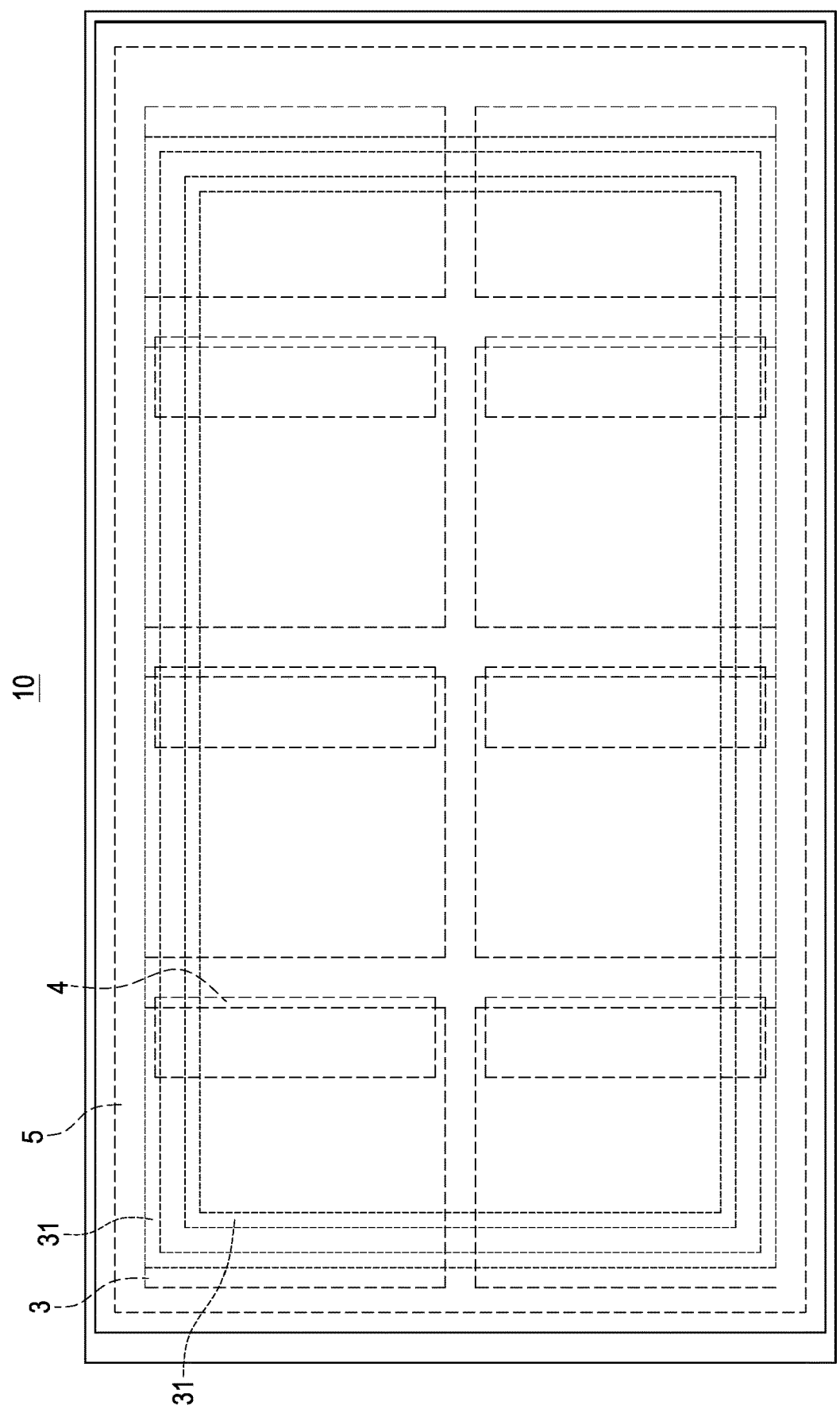
FIG. 5 is top view corresponding to the thin device shown in FIG. 4.

With reference to FIG. 2, groove structure (concave structure) is defined on the optical element 3 of the thin device. As shown in this figure, laser engraving is used to conduct laser etching over inactive area (unused area, namely the area on which active unit of the optical element such as light sensing unit or light emitting unit is not formed) around the optical element 3 after the upper conductive layer 4 is manufactured, thus form at least one groove 31 on the inactive area of the optical element 3. The groove 31 may be formed by laser engraving with following processing parameter, the spot size may be 1-100 um depending on the requirement, the laser energy is 1-5 W, the laser driving is in pulse manner, the etching depth is such that an annular groove (as shown in FIG. 5) is formed on inactive area (unused area) around the optical element 3 on the substrate 1 and the etching depth is shallow enough to not damage the underlying lower conductive layer 2. The groove 31 has width of 10 μm-100 μm. The annular groove 31 may comprise a plurality layers of annular groove structures (or loop groove structures) repeatedly stacked on each other.

Figure 3:
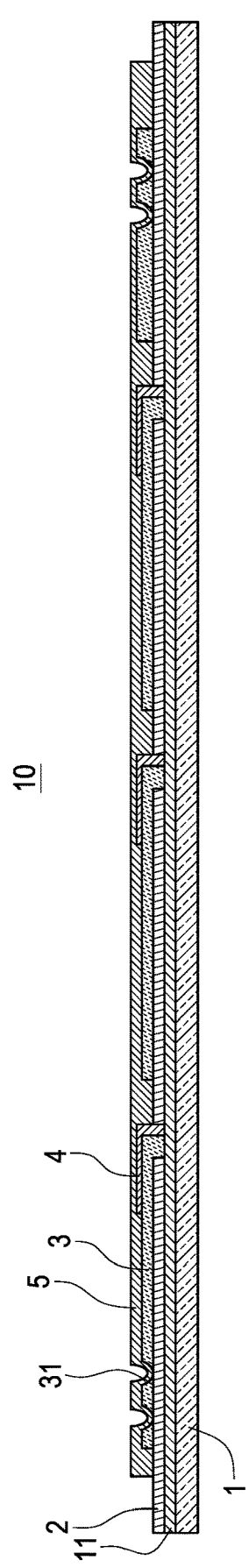
FIG. 3 shows that the sealing layer is formed on the upper conductive layer and the optical element of the thin device shown in FIG. 2.

With reference to FIG. 3, sealing layer is formed on the upper conductive layer 4 and the optical element 3 of the thin device shown in FIG. 2. As shown in this figure, after a groove 31 is formed on the inactive area (unused area) of the optical element 3, a sealing layer 5 is formed on the upper conductive layer 4 and the optical element 3. The sealing layer 5 may be formed by film layer of inorganic metallic oxide such as aluminum oxide ($Al_2O_3$), zinc (Zn) oxide, zicronium (Zr) oxide, silicon oxide, and hafnium (Hf) oxide or the combination thereof. The sealing layer 5 may be formed by a plurality of alternating material layer, which are repeatedly formed by atomic layer deposition (ALD). In an embodiment of the present invention, aluminum oxide film with thickness of 10-80 nm is used. In the present invention, aluminum oxide is stacked by 100-200 times with atomic layer deposition (ALD) to form aluminum oxide film of 30-50 nm. The atomic layer deposition is a thin-film deposition technique heating the precursors of aluminum oxide with inert gases to form vapor and sprays the vapor on the surface of the substrate 1. The ALD technique can provide finer packaging material and form thin layer on the surface of the substrate or the device. Even not shown in this figure, the sealing layer 5 may be formed between the substrate and the lower conductive layer 2, which will be detailed later.

Figure 4:
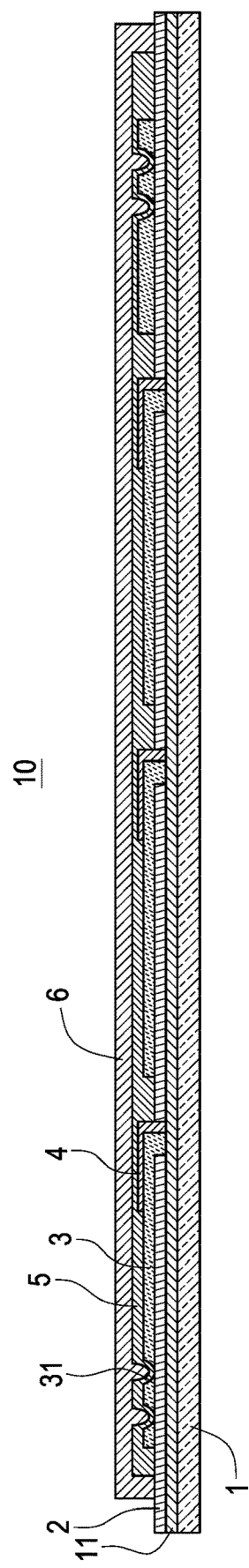
FIG. 4 shows that the barrier layer is formed on the sealing layer of the thin device shown in FIG. 3.

Refer to FIGS. 4 and 5, which respectively show the sectional view of the thin device 10 after barrier layer is formed on the sealing layer and the top view corresponding to the structure shown in FIG. 4. After the sealing layer 5 of the thin device 10 is formed, a barrier layer 6 is formed on the sealing layer 5. The barrier layer 6 may be formed with material having good binding capability with the metallic oxide of the sealing layer 5 and the material is for, example, poly sodium metasilicate, polyvinyl alcohol (PVA), polyacrylate, polyvinyl butyral (PVB), poly hydroxyethyl methacrylate (pHEMA), epoxy or the combination thereof. The barrier layer 6 may be coated by slot die coater and then dried to form film structure with thickness of 0.5 μm-10 μm. In this embodiment, the paste mixed with poly sodium metasilicate and epoxy is used, the paste is coated by slot die coater and then heated with 100☐ to dry and form film with good binding effect with the sealing layer 5 of aluminum oxide, where the dried film of the barrier layer 6 has thickness of 1 μm-3 μm. The barrier layer 6 may fill the voids of sealing layer 5, where the voids are formed during the atomic layer deposition process. Namely, the barrier layer 6 may further fill the surface structure of the sealing layer 5 to enhance the water-resistant and gas-resistant property for package.

Figure 6:
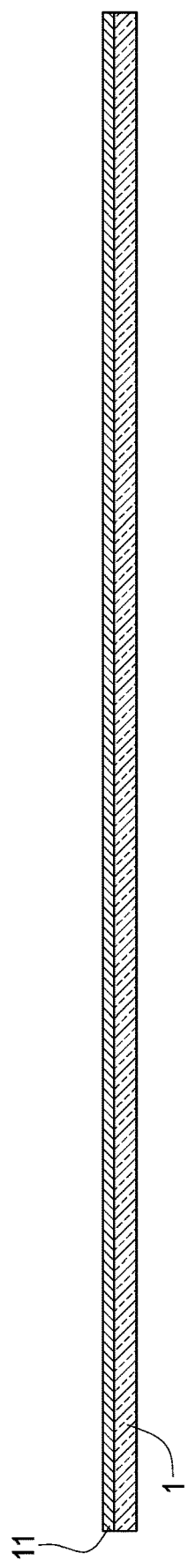
FIG. 6 shows a sectional view of the substrate of the thin device according to the second embodiment of the present invention.
Figure 7:
FIG. 7 shows that the first sealing layer is formed on the cured layer of the thin device shown in FIG. 6.

Refer to FIGS. 6 and 7, which respectively show a sectional view of substrate of the thin device according to the second embodiment of the present invention and a sectional view of the first sealing layer formed on the cured layer of the thin device shown in FIG. 6. As shown in FIG. 6, the second embodiment is similar to the first embodiment; one face of the substrate 1 is cured to form a cured layer 11 to enhance the firmness of the substrate 1. The main component of the cured layer 11 is silicon dioxide. In the shown embodiment, the thickness of the cured layer 11 is 1 μm-3 μm, the substrate 1 is a light-transparent plastic substrate or a light-transparent glass substrate.

The second embodiment is different with the first embodiment in that a first sealing layer 5a is formed on one face of the cured layer 11 after the cured layer 11 is formed. The first sealing layer 5a may be formed by film layer of inorganic metallic oxide such as aluminum oxide ($Al_2O_3$), zinc (Zn) oxide, zicronium (Zr) oxide, silicon oxide, hafnium (Hf) oxide or the combination thereof. The first sealing layer 5a may be formed by a plurality of alternating material layers, which are repeatedly formed by atomic layer deposition (ALD). In an embodiment of the present invention, aluminum oxide film with thickness of 10-80 nm is used.

Refer to FIG. 8, which shows that lower conductive layer, optical element and upper conductive layer are formed on the first sealing layer 5a of the thin device shown in FIG. 7. As shown in FIG. 8, after the first sealing layer 5a is formed, the lower conductive layer 2 is arranged on one face (such as upper face) of the first sealing layer 5a. The lower conductive layer 2 is formed through etching process for inorganic conductive material to have a plurality of transparent electrode circuits (not shown in FIG. 8) and is electrically connected to external device through a connection circuit (not shown). In the embodiment shown in FIG. 8, the inorganic conductive material may be indium tin oxide or silvery paste.

After the lower conductive layer 2 is formed, an optical element 3 is arranged on one face of the lower conductive layer 2. The optical element 3 is, for example, organic light emitting diode (OLED), electro-chromic display, or photovoltaic cell.

After the optical element 3 is formed, an upper conductive layer 4 is arranged on one face of the optical element 3. The upper conductive layer 4 is formed through etching process for inorganic conductive material to have a plurality of transparent electrode circuits (not shown in FIG. 8) and is electrically connected to external device through a connection circuit (not shown). In the embodiment shown in FIG. 8, the inorganic conductive material may be indium tin oxide or silvery paste.

With reference to FIG. 9, groove structure (concave structure) is defined on the thin device of FIG. 8. As shown in this figure, after the lower conductive layer 2, the optical element 3 and the upper conductive layer 4 are formed on the thin device 10, laser engraving is used to conduct laser etching over inactive area (unused area) around the optical element 3, thus form at least one groove 31 on the inactive area of the optical element 3. The groove 31 may be formed by laser engraving with following processing parameters: the spot size may be 1-100 um depending on the requirement, the laser energy is 1-5 W, the laser driving is in pulse manner, the etching depth is such that an annular groove (as shown in FIG. 5) is formed on inactive area (unused area) around the optical element 3 on the substrate 1 and the etching depth is shallow enough to not damage the underlying lower conductive layer 2. The groove 31 has width of 10 μm-100 μm. The annular groove 31 may comprise a plurality of layers of annular groove structures (or loop groove structures) repeatedly stacked on each other.

Refer to FIG. 10, which shows a second sealing layer is formed on the optical element 3 and the upper conductive layer 4 in the thin device 10 shown in FIG. 9. After the groove 31 of the thin device 10 of the second embodiment is formed, a second sealing layer 5b is coated on the optical element 3 and the upper conductive layer 4 in the thin device 10. The second sealing layer 5b may be formed by film layer of inorganic metallic oxide such as aluminum oxide ($Al_2O_3$), zinc (Zn) oxide, zicronium (Zr) oxide, silicon oxide, hafnium (Hf) oxide or the combination thereof. The second sealing layer 5b may be formed by a plurality of alternating material layers, which are repeatedly formed by atomic layer deposition (ALD). In an embodiment of the present invention, aluminum oxide film with thickness of 10-80 nm is used. In the present invention, aluminum oxide is stacked by 100-200 times with atomic layer deposition (ALD) to form aluminum oxide film of 30-50 nm. The atomic layer deposition is a thin-film deposition technique heating the precursors of aluminum oxide with inert gases to form vapor and sprays the vapor on the surface of the substrate 1. The ALD technique can provide finer packaging material and form thin layer on the surface of the substrate or the device.

Refer to FIG. 11, which is sectional view of the thin device 10 after barrier layer is formed on the second sealing layer. After the second sealing layer 5b of the thin device 10 according to the second embodiment is formed, a barrier layer 6 is formed on the second sealing layer 5b. The barrier layer 6 may be formed with material having good binding capability with the metallic oxide of the second sealing layer 5b and the material is for, example, poly sodium metasilicate, polyvinyl alcohol (PVA), polyacrylate, polyvinyl butyral (PVB), poly hydroxyethyl methacrylate (pHEMA), epoxy or the combination thereof. The barrier layer 6 may be coated by slot die coater and the dried to form film structure with thickness of 0.5 µm-10 µm. In this embodiment, the paste mixed with poly sodium metasilicate and epoxy is used, the paste is coated by slot die coater and then heated with 100☐ to dry and form film with good binding effect with the second sealing layer 5b of aluminum oxide, where the dried film of the barrier layer 6 has thickness of 1 µm-3 µm. The barrier layer 6 may fill the void of the second sealing layer 5b, where the voids are formed during the atomic layer deposition process. Namely, the barrier layer 6 may further fill the surface structure of the sealing layer 5 to enhance the water-resistant and gas-resistant property for package.

Moreover, the sealing layer and the barrier layer according to the present invention may be repeatedly and alternately stacked on the thin device.

To sum up, in the packaging structure with groove according to the present invention, a plurality of sealing layers 5, 5a, 5b and barrier layers 6 are used and groove is formed to provide blocking interface between package and the substrate, thus enhance the water-resistant and gas-resistant property for package.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A packaging structure with groove, the packaging structure comprising:
    a substrate;
    a lower conductive layer arranged on the substrate;
    an optical element arranged on the lower conductive layer; and
    an upper conductive layer arranged on the optical element;
    wherein the optical element comprises a groove disposed on an inactive area thereof away from the upper conductive layer, the packaging structure further comprises a sealing layer disposed on one the optical element and the upper conductive layer, and a barrier layer disposed on the sealing layer, the sealing layer comprises a concave portion corresponding to the groove,
    the groove comprises a plurality of layers of annular groove structures or loop groove structures repeatedly stacked on each other.

2. The packaging structure with groove in claim 1, wherein the substrate is light-transparent plastic substrate or light-transparent glass substrate.

3. The packaging structure with groove in claim 1, further comprising a cured layer between the substrate and the lower conductive layer.

4. The packaging structure with groove in claim 1, wherein the optical element is organic light emitting diode (OLED), electro-chromic display, or photovoltaic cell.

5. The packaging structure with groove in claim 4, wherein the photovoltaic cell is organic solar cell or perovskite thin film solar cell.

6. The packaging structure with groove in claim 1, wherein the groove has width of 10 µm-100 µm.

7. The packaging structure with groove in claim 1, wherein the sealing layer is inorganic metallic oxide.

8. The packaging structure with groove in claim 7, wherein the inorganic metallic oxide is aluminum oxide, zinc oxide, zicronium oxide, silicon oxide, hafnium oxide or the combination thereof.

9. The packaging structure with groove in claim 1, wherein the barrier layer is poly sodium metasilicate, polyvinyl alcohol (PVA), polyacrylate, polyvinyl butyral (PVB), poly hydroxyethyl methacrylate (pHEMA), epoxy or the combination thereof.

10. The packaging structure with groove in claim 1, wherein the sealing layer and the barrier layer are repeatedly and alternately stacked.

11. A packaging structure with groove, the packaging structure comprising:
    a substrate;
    a first sealing layer arranged on the substrate;
    a lower conductive layer arranged on the first sealing layer;
    an optical element arranged on the lower conductive layer; and
    an upper conductive layer arranged on the optical element;
    wherein the optical element comprises a groove disposed on an inactive area thereof away from the upper conductive layer, the packaging structure further comprises a second sealing layer disposed on the optical element and the upper conductive layer, and a barrier layer disposed on the second sealing layer, the second sealing layer comprises a concave portion corresponding to the groove,
    the groove comprises a plurality of layers of annular groove structures or loop groove structures repeatedly stacked on each other.

12. The packaging structure with groove in claim 11, wherein the substrate is light-transparent plastic substrate or light-transparent glass substrate.

13. The packaging structure with groove in claim 11, further comprising a cured layer between the substrate and the lower conductive layer.

14. The packaging structure with groove in claim 11, wherein the optical element is organic light emitting diode (OLED), electro-chromic display, or photovoltaic cell.

15. The packaging structure with groove in claim 14, wherein the photovoltaic cell is organic solar cell or perovskite thin film solar cell.

16. The packaging structure with groove in claim 11, wherein the groove has width of 10 µm-100 µm.

17. The packaging structure with groove in claim 11, wherein the first sealing layer and the second sealing layer are inorganic metallic oxide.

18. The packaging structure with groove in claim 17, wherein the inorganic metallic oxide is aluminum oxide, zinc oxide, zicronium oxide, silicon oxide, hafnium oxide or the combination thereof.

19. The packaging structure with groove in claim 11, wherein the barrier layer is poly sodium metasilicate, polyvinyl alcohol (PVA), polyacrylate, polyvinyl butyral (PVB), poly hydroxyethyl methacrylate (pHEMA), epoxy or the combination thereof.

20. The packaging structure with groove in claim 11, wherein the second sealing layer and the barrier layer are repeatedly and alternately stacked.

* * * * *